(12) United States Patent
Nam et al.

(10) Patent No.: US 9,831,464 B2
(45) Date of Patent: Nov. 28, 2017

(54) ORGANIC LIGHT EMITTING DIODE DISPLAY AND METHOD OF MANUFACTURING THE SAME

(71) Applicant: SAMSUNG DISPLAY CO., LTD., Yongin, Gyeonggi-Do (KR)

(72) Inventors: Seung Wook Nam, Cheonan-si (KR); Yong Cheol Jeong, Yongin-si (KR); Ah Young Kim, Gunpo-si (KR); Kyu-Taek Lee, Cheonan-si (KR); So Yeon Han, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 255 days.

(21) Appl. No.: 14/853,467

(22) Filed: Sep. 14, 2015

(65) Prior Publication Data
US 2016/0226017 A1 Aug. 4, 2016

(30) Foreign Application Priority Data
Feb. 2, 2015 (KR) .......................... 10-2015-0016351

(51) Int. Cl.
*H01L 51/52* (2006.01)
(52) U.S. Cl.
CPC ........ *H01L 51/5246* (2013.01); *H01L 51/524* (2013.01); *H01L 2251/5338* (2013.01)
(58) Field of Classification Search
CPC ............... H01L 51/5246; H01L 51/524; H01L 2251/5338
See application file for complete search history.

(56) References Cited

U.S. PATENT DOCUMENTS

| 2013/0002583 | A1* | 1/2013 | Jin | G06F 1/1637 345/173 |
| 2013/0034685 | A1 | 2/2013 | An et al. | |
| 2014/0055702 | A1* | 2/2014 | Park | G02F 1/136286 349/43 |
| 2014/0232956 | A1* | 8/2014 | Kwon | G02F 1/133305 349/12 |
| 2015/0207102 | A1* | 7/2015 | Jeong | H04M 1/0268 257/40 |

(Continued)

FOREIGN PATENT DOCUMENTS

| JP | 2011-027822 A | 2/2011 |
| KR | 10-0444412 B1 | 11/2004 |

(Continued)

*Primary Examiner* — Mary Ellen Bowman
(74) *Attorney, Agent, or Firm* — Lee & Morse, P.C.

(57) ABSTRACT

An organic light emitting diode display, which is foldable about a folding central axis, and in which a folding area including the folding central axis and a non-folding area except for the folding area are defined, the organic light emitting diode display including a first panel having flexibility; a second panel on the first panel and having flexibility; a third panel on the second panel and having flexibility; a first adhesive layer between the first panel and the second panel to bond the first panel and the second panel to each other; and a second adhesive layer between the second panel and the third panel to bond the second panel and the third panel to each other, wherein at least one of the first adhesive layer and the second adhesive layer includes a first reinforcing material.

20 Claims, 16 Drawing Sheets

(56) References Cited

U.S. PATENT DOCUMENTS

| | | | |
|---|---|---|---|
| 2015/0227172 A1* | 8/2015 | Namkung | G06F 1/1652 345/173 |
| 2015/0263300 A1* | 9/2015 | Namkung | H01L 51/0097 257/40 |
| 2015/0263301 A1* | 9/2015 | Namkung | H01L 51/5237 257/40 |
| 2015/0301636 A1* | 10/2015 | Akimoto | G06F 3/044 345/173 |
| 2015/0325804 A1* | 11/2015 | Lindblad | H01L 51/52 313/511 |
| 2016/0035812 A1* | 2/2016 | Kwon | H01L 27/3276 257/40 |
| 2016/0066409 A1* | 3/2016 | Kwon | H05K 1/028 174/254 |
| 2016/0155967 A1* | 6/2016 | Lee | H01L 51/5281 257/88 |
| 2016/0226017 A1* | 8/2016 | Nam | H01L 51/5246 |
| 2016/0259194 A1* | 9/2016 | Yao | G06F 3/0412 |
| 2016/0323966 A1* | 11/2016 | Hamel | H05B 33/26 |
| 2016/0364044 A1* | 12/2016 | Kim | H01L 51/0097 |
| 2016/0380033 A1* | 12/2016 | Lee | H01L 27/323 257/40 |
| 2017/0084673 A1* | 3/2017 | Lee | H01L 27/3244 |
| 2017/0166786 A1* | 6/2017 | Moon | C09J 133/066 |

FOREIGN PATENT DOCUMENTS

| | | |
|---|---|---|
| KR | 10-2005-0102937 A | 10/2005 |
| KR | 10-2008-0070357 A | 7/2008 |
| KR | 10-2013-0031910 A | 3/2013 |
| KR | 10-2013-0120721 A | 11/2013 |
| KR | 10-2014-0033546 A | 3/2014 |

* cited by examiner

ORGANIC LIGHT EMITTING DIODE DISPLAY AND METHOD OF MANUFACTURING THE SAME

CROSS-REFERENCE TO RELATED APPLICATION

Korean Patent Application No. 10-2015-0016351, filed on Feb. 2, 2015, in the Korean Intellectual Property Office, and entitled: "Organic Light Emitting Diode Display and Method Of Manufacturing The Same," is incorporated by reference herein in its entirety.

BACKGROUND

1. Field

Embodiments relate to an organic light emitting diode display and a method of manufacturing the same.

2. Description of the Related Art

A display device is a device displaying an image, and an organic light emitting diode display has recently received attention.

The organic light emitting diode display has a self-emissive characteristic and does not require a separate light source, unlike a liquid crystal display device, so that it is possible to reduce a thickness and weight thereof. Further, the organic light emitting diode display has high-quality characteristics, such as low power consumption, high luminance, and a high reaction speed.

In the meantime, together with recent development of display-related technology, display devices that are deformable, e.g., foldable, rollable in a roll shape, or stretchable like a rubber band, during use, have been considered. The display devices may display various user interfaces and images according to a deformation form, so that utilization thereof may be high.

The above information disclosed in this Background section is only for enhancement of understanding of the background of the described technology and therefore it may contain information that does not form the prior art that is already known in this country to a person of ordinary skill in the art.

SUMMARY

Embodiments are directed to an organic light emitting diode display and a method of manufacturing the same.

The embodiments may be realized by providing organic light emitting diode display, which is foldable about a folding central axis, and in which a folding area including the folding central axis and a non-folding area except for the folding area are defined, the organic light emitting diode display including a first panel having flexibility; a second panel on the first panel and having flexibility; a third panel on the second panel and having flexibility; a first adhesive layer between the first panel and the second panel to bond the first panel and the second panel to each other; and a second adhesive layer between the second panel and the third panel to bond the second panel and the third panel to each other, wherein at least one of the first adhesive layer and the second adhesive layer includes a first reinforcing material.

The first panel may be a display panel, the second panel may be a touch panel, and the third panel may be a window substrate.

The non-folding area of the at least one of the first adhesive layer or the second adhesive layer may include the first reinforcing material.

The first reinforcing material may include at least one bead.

The at least one bead may include a transparent silicon bead.

The at least one bead may have an exterior diameter that is smaller than a thickness of the first adhesive layer or the second adhesive layer that includes the at least one bead.

The first reinforcing material may include at least one column spacer.

The at least one column spacer may include a transparent column spacer.

The at least one column spacer may have a height that is smaller than a thickness of the first adhesive layer or the second adhesive layer that includes the at least one column spacer.

The first reinforcing material may include two or more column spacers.

Intervals between adjacent column spacers may be the same as intervals between other adjacent column spacers.

The third panel may include a first base film bonded to the second panel by the second adhesive layer; a second base film on the first base film; and a functional layer bonded to the second base film, and the first base film and the second base film may be bonded to each other by a third adhesive layer.

The non-folding area of the third adhesive layer may include a second reinforcing material.

The second reinforcing material may include at least one bead or at least one column spacer.

The second reinforcing member may include the at least one bead, and the at least one bead may have an exterior diameter that is smaller than a thickness of the third adhesive layer.

The second reinforcing member may include the at least one column spacer, and the at least one column spacer may have a height that is smaller than a thickness of the third adhesive layer.

The embodiments may be realized by providing a method of manufacturing an organic light emitting diode display, in which a folding area including a folding central axis and a non-folding area except for the folding area are defined, and which is foldable about the folding central axis, the method including preparing a first panel having flexibility; stacking a first adhesive layer on the first panel; and bonding a second panel to the first adhesive layer, wherein the first adhesive layer includes beads in the non-folding area thereof.

The method may further include dispersing the beads after stacking the first adhesive layer on the first panel when the first adhesive layer is an optical clear resin.

The method may further include dispersing the beads in the non-folding area of the first adhesive layer prior to stacking the first adhesive layer on the first panel when the first adhesive layer is a pressure sensitive adhesive.

The embodiments may be realized by providing a method of manufacturing an organic light emitting diode display, in which a folding area including a folding central axis and a non-folding area except for the folding area are defined, and which is foldable about the folding central axis, the method including preparing a first panel having flexibility; disposing column spacers on the non-folding area of the first panel; applying a first adhesive layer on a surface of the first panel that includes the column spacers thereon; and bonding a second panel to the first adhesive layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
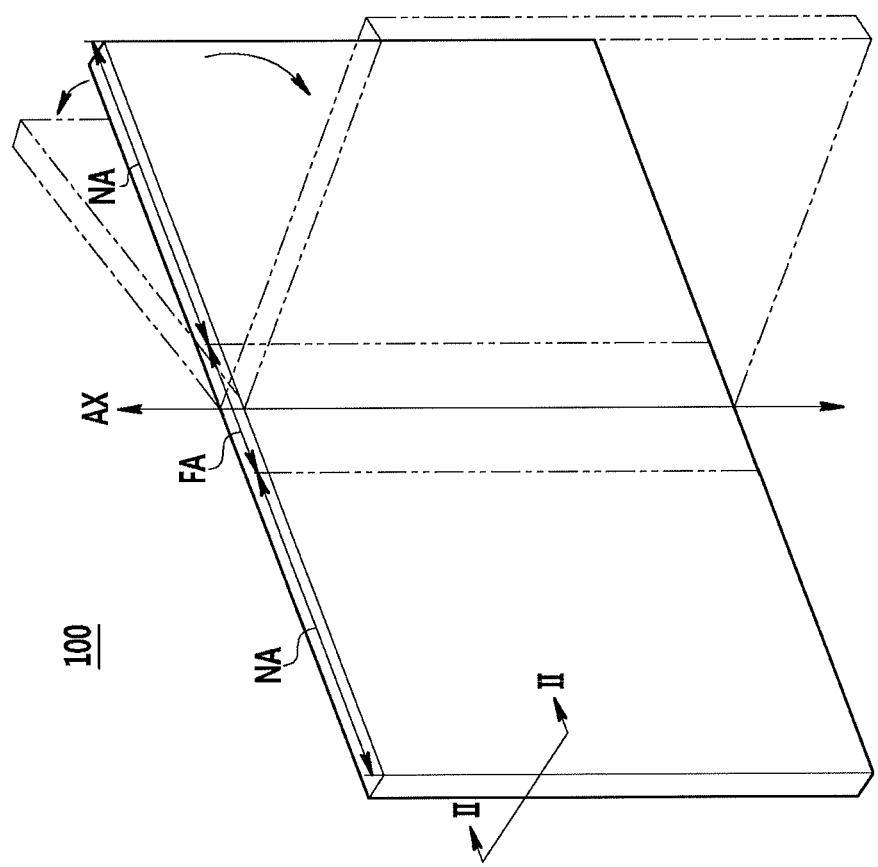
FIG. 1 illustrates a perspective view of an organic light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Further, in the specification, the word "on" means positioning on or below the object portion, but does not essentially mean positioning on the upper side of the object portion based on a gravity direction.

In addition, unless explicitly described to the contrary, the word "comprise" and variations such as "comprises," "includes," or "comprising", will be understood to imply the inclusion of stated elements but not the exclusion of any other elements.

Hereinafter, a schematic disposition structure of an organic light emitting diode display according to an exemplary embodiment will be described with reference to FIGS. 1 and 2.

FIG. 1 illustrates a perspective view of an organic light emitting diode display according to an exemplary embodiment. FIG. 2 illustrates schematic cross-sectional views taken along line II-II of FIG. 1.

Referring to FIG. 1, an organic light emitting diode display 100 according to an exemplary embodiment may be a foldable display device which has flexibility, and may be capable of performing a folding operation by setting one axis as a folding central axis AX.

In the organic light emitting diode display 100, the folding central axis AX and an area adjacent to the folding central axis AX that is directly deformed by folding stress may be defined as a folding area FA. Remaining areas, e.g., except for or other than the folding area FA, may be defined as a non-folding area NA. In the present exemplary embodiment, as illustrated in FIG. 1, the folding central axis AX may be set to a position vertically crossing a center portion of the organic light emitting diode display 100 based on FIG. 1. For example, one folding area FA may be defined adjacent to the folding central axis AX and two non-folding areas NA may be defined adjacent to the folding area.

In an implementation, a position of the folding central axis AX, the number of folding central axes, positions and disposition of the folding area FA and the non-folding area NA, or the like may be varied according to a particular display device. For example, the folding central axis may be positioned at a left side or a right side of the position shown in FIG. 1, and/or may be set in a horizontal direction, not the vertical direction of FIG. 1, and two folding central axes crossing each other may also be set.

Figure 2:
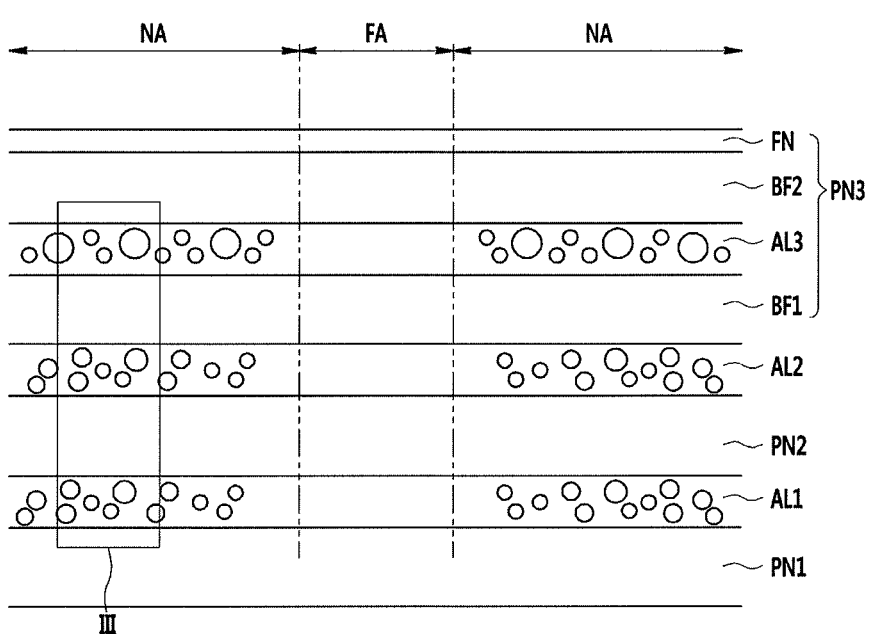
FIG. 2 illustrates schematic cross-sectional views taken along line II-II of FIG. 1.

Referring to FIG. 2, the organic light emitting diode display 100 according to the exemplary embodiment may include, e.g., a first panel PN1, a second panel PN2, a third panel PN3, a first adhesive layer AL1, a second adhesive layer AL2, and a first reinforcing material RF1.

The first panel PN1 may be positioned at a lowermost end, e.g., one outermost side, of the organic light emitting diode display 100, and the second panel PN2 and the third panel PN3 may be sequentially positioned on the first panel PN1.

The first adhesive layer AL1 may be between the first panel PN1 and the second panel PN2 to bond the two panels to each other. The second adhesive layer AL2 may be between the second panel PN2 and the third panel PN3 to bond the two panels to each other.

Each of the first panel PN1, the second panel PN2, the third panel PN3, the first adhesive layer AL1, and the second adhesive layer AL2 may be defined into the folding area FA (including the folding central axis AX) and the non-folding area NA (adjacent to the folding area FA) as illustrated in FIG. 2. For example, each of the first panel PN1, the second panel PN2, the third panel PN3, the first adhesive layer AL1, and the second adhesive layer AL2 may include an area thereof that corresponds with the folding area FA and an area thereof that corresponds with the non-folding area NA.

The first panel PN1 may be, e.g., a display panel in which a thin film transistor, an organic light emission layer, an electrode layer, and an encapsulation layer are sequentially stacked. The second panel PN2 may be, e.g., a touch panel including a touch sensor electrode and a polarizing plate. The first panel PN1 and the second panel PN2 may include, e.g., an insulating base substrate formed of glass, quartz, ceramic, metal, plastic, or the like. For example, when the base substrate is formed of plastic, such as polyimide (PI), each panel may have flexibility so as to perform a foldable, a stretchable, or a rollable operation.

The first adhesive layer AL1 and the second adhesive layer AL2 may include, e.g., any one of an optical clear resin (OCR) or a pressure sensitive adhesive (PSA). The OCR and the PSA may be high elastic materials, so that the first adhesive layer AL1 and the second adhesive layer AL2 may have flexibility.

The third panel PN3 may be a window substrate that is in direct contact with an external side (e.g., another outermost side of the organic light emitting diode display 100), and may protect the first panel PN1 and the second panel PN2 (under the third panel PN3). The third panel PN3 may include a first base film BF1, a second base film BF2, a functional layer FN, and a third adhesive layer AL3.

The first base film BF1 may be stacked on the second adhesive layer AL2. The third adhesive layer AL3, the second base film BF2, and the functional layer FN may be sequentially stacked on the first base film BF1.

The first base film BF1 and the second base film BF2 may be formed of, e.g., plastic or the like, and may have flexibility. In an implementation, the first base film BF1 and the second base film BF2 may be formed of, e.g., at least one of polyethylene terephthalate (PET), polycarbonate (PC), polyimide (PI), and polymethyl methacrylate (PMMA). In an implementation, the first base film BF1 and the second base film BF2 may be made of a same kind of plastic or different kinds of plastic. In an implementation, the first base film BF1 and the second base film BF2 may have a structure in which a multilayer base film is stacked by an adhesive layer.

The functional layer FN may be bonded onto the second base film BF2 to help protect an upper portion of the third panel PN3 from, e.g., external scratches, pressure, or the like. The functional layer FN may include, e.g., at least one of a hard coating film, an anti-fingerprint film, an anti-reflection film, and an anti-glare film.

The third adhesive layer AL3 may be, e.g., any one of the OCR and the PSA. The third adhesive layer AL3 may also have flexibility, e.g., similar to the aforementioned first adhesive layer AL1 and second adhesive layer AL2.

As described above, when a base of the third panel PN3 is formed of multiple layers including, e.g., the first base film BF1 and the second base film BF2, a deformation rate of the adhesive layer due to folding stress may be decreased, compared to the entire window substrate and unlike a general window substrate using one base film. Thus, it is possible to help improve hardness of the window substrate. Further, it is possible to help improve hardness of the window substrate without degrading flexibility of the entire window substrate, compared to a method of simply forming the base to be thick.

Hereinafter, a configuration and a disposition relation of the first reinforcing material RF1 and the second reinforcing material RF2 of the organic light emitting diode display 100 according to the exemplary embodiment will be described with reference to FIG. 3.

Figure 3:
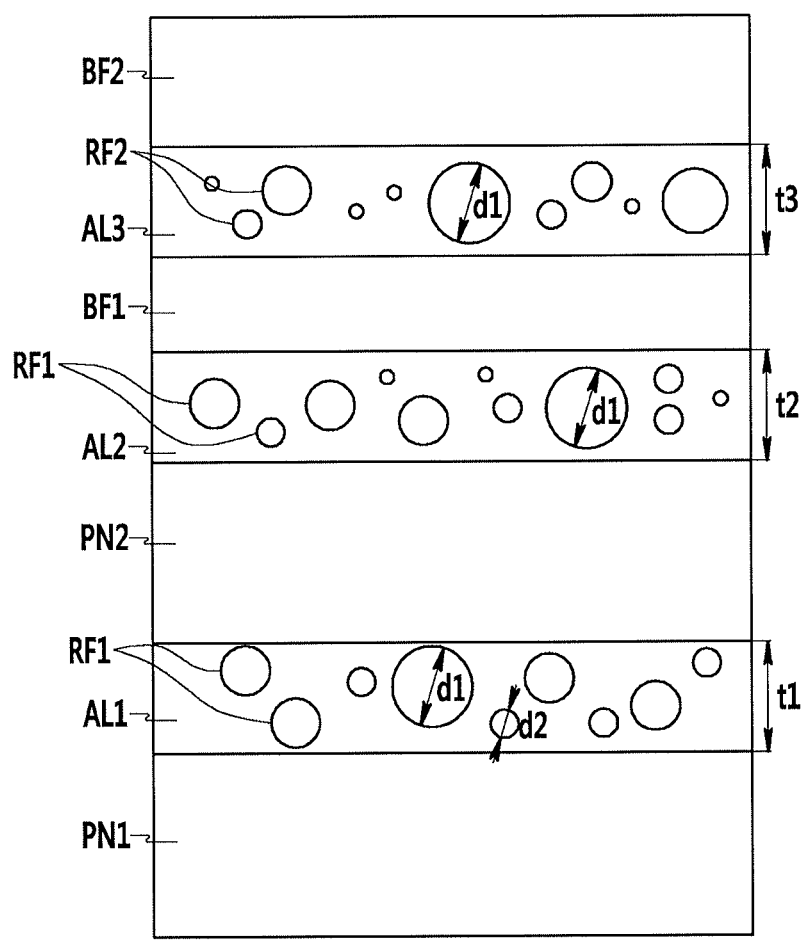
FIG. 3 illustrates an enlarged view of portion III of FIG. 2.

FIG. 3 illustrates an enlarged view of portion III of FIG. 2.

The first reinforcing material RF1 may be disposed in the non-folding area NA of any one of the first adhesive layer AL1 and the second adhesive layer AL2. For example, the first reinforcing material RF1 may be disposed in each of the first adhesive layer AL1 and the second adhesive layer AL2, and/or the first reinforcing material RF1 may be disposed in one of the first adhesive layer AL1 or the second adhesive layer AL2. For example, the non-folding area NA of the first adhesive layer AL1 and/or the second adhesive layer AL2 may include the first reinforcing material RF1.

In an implementation, the first reinforcing material RF1 may include a bead, e.g., a silicon bead. In an implementation, the first reinforcing material RF1 may include two or more transparent silicon beads, as illustrated in FIG. 3. In an implementation, exterior diameters d1 and d2 of the two or more transparent silicon beads may be different from each other as illustrated in FIG. 3.

As described above, it is possible to maintain visibility of the display device by transparently forming the first reinforcing material RF1, and it is possible to variously adjust or select hardness of the non-folding area NA of the first adhesive layer AL1 or the second adhesive layer AL2 including the first reinforcing material RF1 by disposing the two or more transparent silicon beads having different exterior diameters.

The exterior diameters d1 and d2 of the transparent silicon beads may be smaller than a thickness t1 or t2 of the adhesive layer (AL1 and/or AL2) that includes the transparent silicon beads. In an implementation, it is possible to control or select the exterior diameter of the transparent silicon beads and/or a bonding thickness of the adhesive layer so that the exterior diameter of the transparent silicon beads may be 1% to 95% of the thickness of the adhesive layer that includes the transparent silicon beads.

The transparent silicon beads may be formed with the exterior diameter smaller than the thickness of the adhesive layer as described above, so that it is possible to help prevent the transparent silicon beads from colliding with or contacting the first and/or second panels PN1 and PN2, e.g., by protruding from the adhesive layer, in an upper direction and being adjacent to each other.

The second reinforcing material RF2 may be disposed in the non-folding area NA of the third adhesive layer AL3. In an implementation, the second reinforcing material RF2 may include, e.g., two or more transparent silicon beads. In an implementation, the second reinforcing material RF2 may be the same as those of the aforementioned first reinforcing material RF1. As described above, it is possible to variously adjust hardness of the adhesive layer inside the window substrate including two or more base films by disposing the second reinforcing material RF2 even on or in the third adhesive layer AL3.

Hereinafter, a configuration and a disposition relation of a first reinforcing material RF1 and a second reinforcing material RF2 of an organic light emitting diode display 101 according to a first modified example of the exemplary embodiment will be described with reference to FIG. 4.

Figure 4:
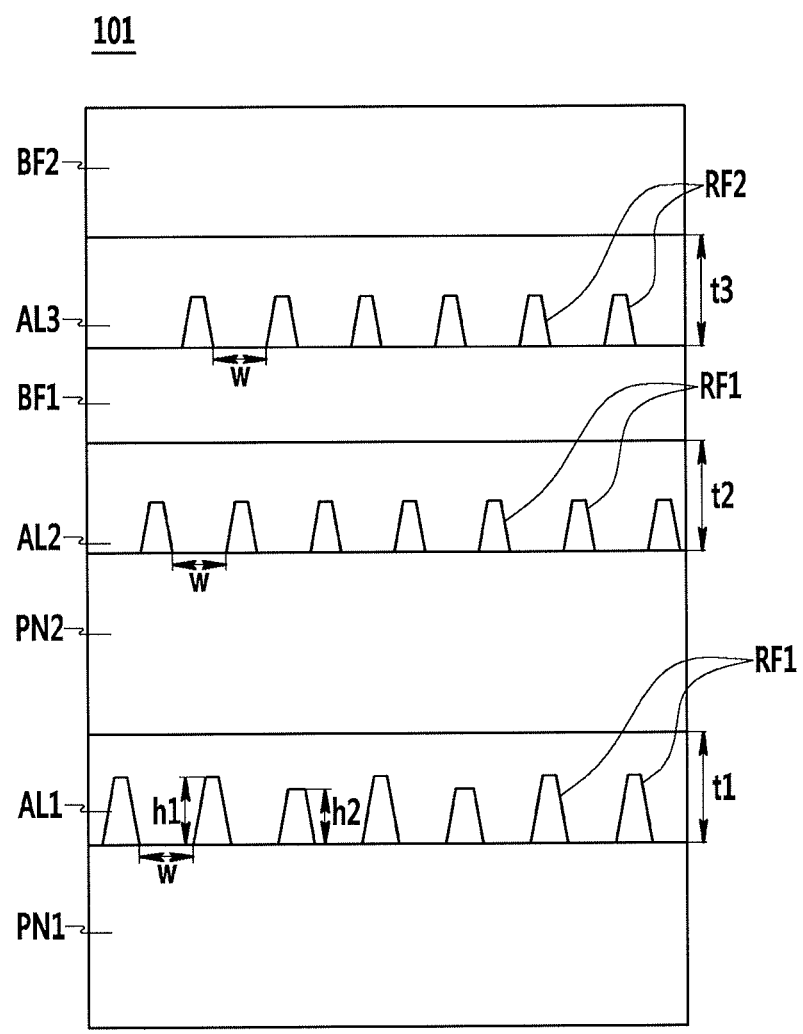
FIG. 4 illustrates a first modified example of FIG. 3.

FIG. 4 illustrates a first modified example of FIG. 3.

Referring to FIG. 4, the organic light emitting diode display 101 according to the first modified example of the exemplary embodiment may have the same configuration as that of the aforementioned organic light emitting diode display 100 except that the first reinforcing material RF1 and second reinforcing material RF2 may include at least one transparent column spacer.

In an implementation, each of the first reinforcing material RF1 and the second reinforcing material RF2 may include two or more transparent column spacers, as illustrated in FIG. 4. In an implementation, heights h1 and h2 of the two or more transparent column spaces may be different from each other, as illustrated in FIG. 4. The heights h1 and h2 of the transparent column spaces may be smaller than thicknesses t1, t2, and t3 of the first, second, and/or third adhesive layers that include the transparent column spacers. In an implementation, the transparent column spacers may be disposed so that intervals w between adjacent transparent column spacers are the same.

In the organic light emitting diode display 101 according to the first modified example of the exemplary embodiment, it is possible to help minimize a possibility of friction with or between panels due to folding stress by disposing, e.g., two or more transparent column spacers having different heights and spaced apart from each other at the same interval. For example, a spacer having a relatively smaller height may be positioned closer to the folding area FA, such that it is possible to design various dispositions of the transparent column spacers.

Hereinafter, a disposition relation of a first reinforcing material RF1 and a second reinforcing material RF2 of an organic light emitting diode display 102 according to a second modified example of the exemplary embodiment will be described with reference to FIG. 5.

Figure 5:
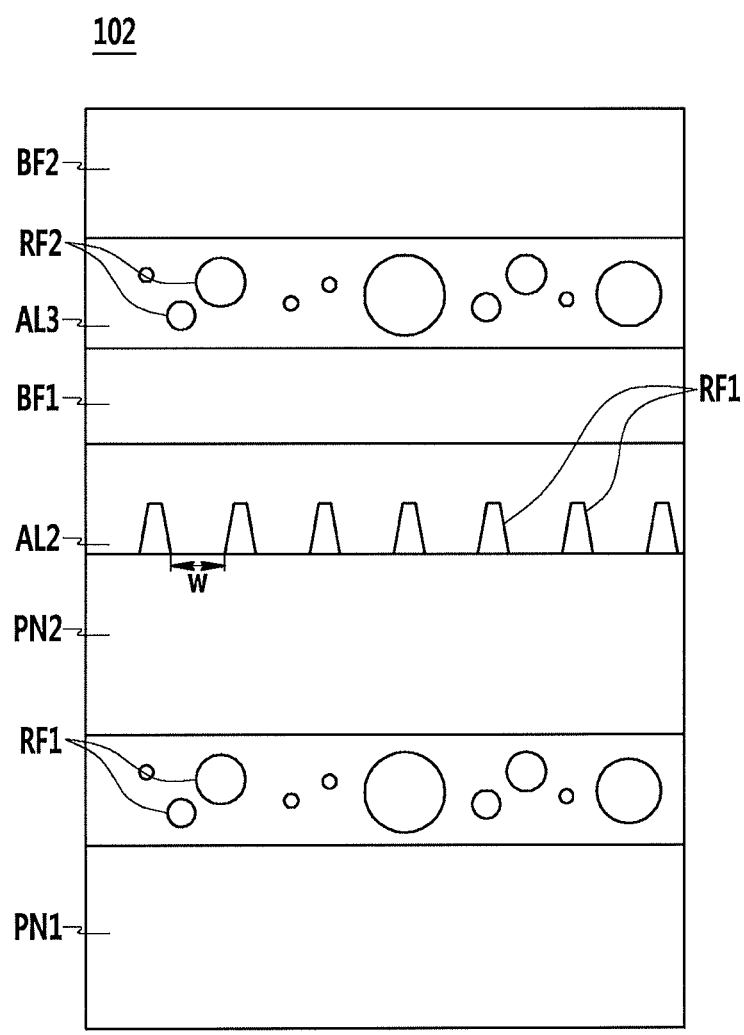
FIG. 5 illustrates a second modified example of FIG. 3.

FIG. 5 illustrates a second modified example of FIG. 3.

Referring to FIG. 5, the organic light emitting diode display 102 according to the second modified example of the exemplary embodiment may have the same configuration as that of the aforementioned organic light emitting diode display 100 of FIG. 3 and the aforementioned organic light emitting diode display 101 of FIG. 4, except that a first reinforcing material RF1 and a second reinforcing material RF2 may include any one of a transparent silicon bead or a column spacer.

In the organic light emitting diode display 102, transparent silicon beads and transparent column spacers may be disposed in a first adhesive layer AL1 and a second adhesive layer AL2 as the first reinforcing material RF1, and transparent silicon beads may be disposed in a third adhesive layer AL3 as the second reinforcing material RF2.

As described above, in the second modified example of the exemplary embodiment, the transparent column spacers or the transparent silicon beads may be selectively disposed according to the adhesive layer, so that it is possible to variously select the kind of first reinforcing material RF1 and second reinforcing material RF2 according to a thickness of each adhesive layer, a thickness of a panel, and the like.

Further, in the organic light emitting diode display 100 according to the exemplary embodiment, it is possible to help minimize degradation of hardness of the non-folding area NA due to folding stress by selectively disposing the bead or the column spacer in the non-folding areas NA of the first, second, and/or third adhesive layers AL1, AL2, and AL3.

Hereinafter, a first manufacturing method of the organic light emitting diode display 100 according to the exemplary embodiment will be described with reference to FIGS. 6 to 9.

FIGS. 6 to 9 illustrate stages in a first manufacturing method of the organic light emitting diode display according to an exemplary embodiment.

The first manufacturing method of the organic light emitting diode display 100 according to the exemplary embodiment may include, e.g., preparing the first panel PN1 having flexibility; stacking the first adhesive layer on the first panel; dispersing beads in the non-folding area of the first adhesive layer; and bonding the second panel to the first adhesive layer.

Figure 6:
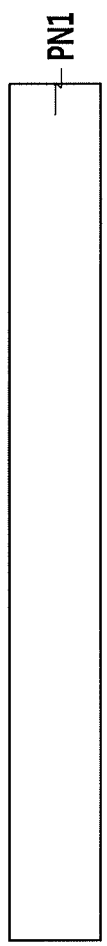
FIGS. 6 to 9 illustrate stages in a first manufacturing method of the organic light emitting diode display according to an exemplary embodiment.

In the preparing of the first panel PN1, the first panel PN1 may be prepared as a base as illustrated in FIG. 6. The first panel PN1 may be a display panel in which a thin film transistor, an organic light emission layer, an electrode layer, and/or an encapsulation layer are sequentially stacked as described above.

Figure 7:
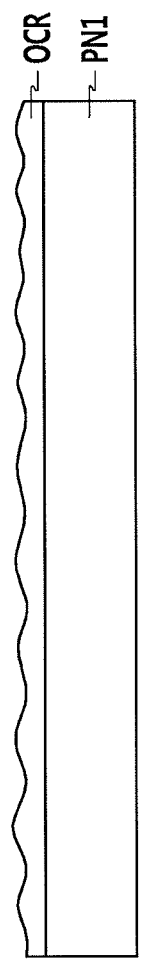

In the stacking of the first adhesive layer, a liquid OCR may be applied onto the first panel PN1 as illustrated in FIG. 7. In the exemplary embodiment, the OCR may be applied in a thickness of 200 µm or less, with a view toward flexibility of the finally formed adhesive layer.

Figure 8:
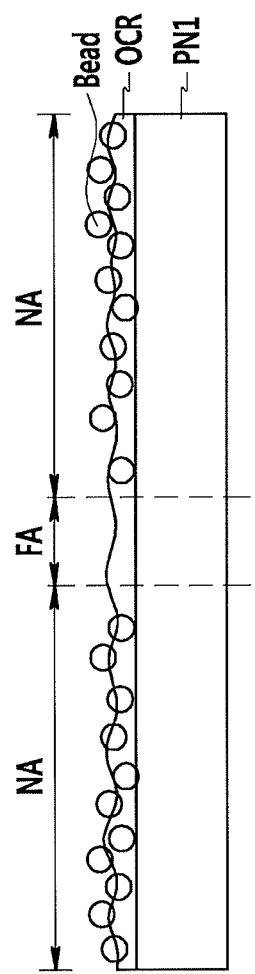

In the dispersing of the beads, e.g., two or more beads may be disposed in the non-folding area NA of the liquid OCR as illustrated in FIG. 8. Then, an upper surface of the liquid OCR may be planarized so that the beads are positioned inside the OCR without protruding from an upper portion of the liquid OCR.

Figure 9:
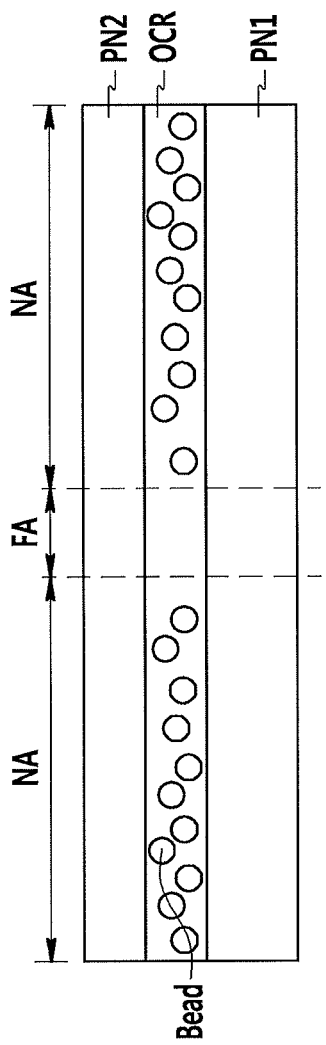

In the bonding of the second panel PN2, the second panel PN2 may be disposed on the liquid OCR (in which the beads have been dispersed in the non-folding area NA) and then the OCR may be cured, as illustrated in FIG. 9.

After the aforementioned operations, the aforementioned second adhesive layer AL2 and the third panel PN3, which are illustrated in FIG. 3, may be sequentially stacked by the same or similar method as the aforementioned method to manufacture the organic light emitting diode display 100.

As described above, the first manufacturing method of the organic light emitting diode display 100 according to the exemplary embodiment may manufacture the organic light emitting diode display 100, which is capable of uniformly maintaining hardness of the entire display, even against folding stress, by adding only the process of dispersing and disposing the two or more beads in the liquid OCR.

Hereinafter, a second manufacturing method of the organic light emitting diode display 100 according to the exemplary embodiment will be described with reference to FIGS. 10 to 12.

Figure 10:
FIGS. 10 to 12 illustrate stages in a second manufacturing method of the organic light emitting diode display according to an exemplary embodiment.
Figure 11:
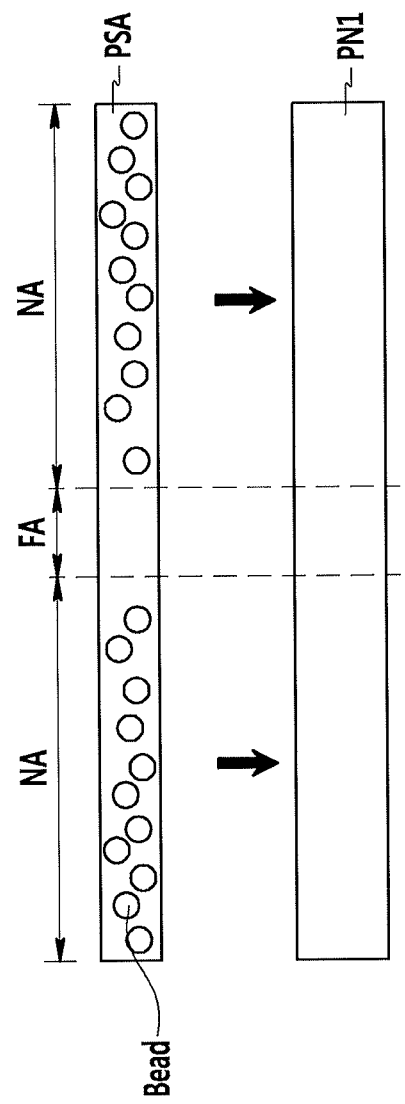
Figure 12:
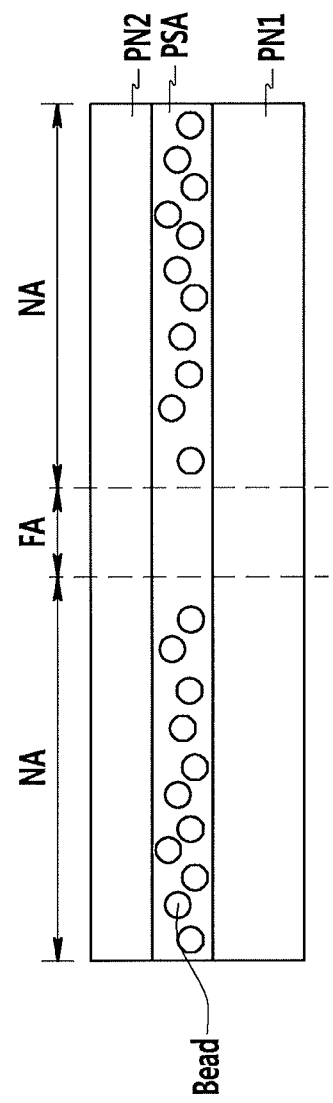

FIGS. 10 to 12 illustrate stages in a second manufacturing method of the organic light emitting diode display according to an exemplary embodiment.

The second manufacturing method of the organic light emitting diode display 100 according to the exemplary embodiment may include, e.g., preparing a first panel PN1 having flexibility; dispersing beads in a non-folding area NA of a first adhesive layer; and stacking the first adhesive layer (in which the beads have been dispersed) on the first panel PN1.

In the preparing of the first panel PN1, the first panel PN1 may be prepared as a base as illustrated in FIG. 10. The first panel PN1 may be a display panel in which a thin film transistor, an organic light emission layer, an electrode layer, and an encapsulation layer are sequentially stacked as described above.

In the dispersing of the beads, two or more beads may be disposed in the non-folding area NA of a solid PSA. Then, both surfaces of the PSA may be planarized so as to prevent the beads from protruding from the solid PSA in an upper or lower direction. Then, the PSA (both surfaces of which having been planarized) may be stacked on the first panel PN1 as illustrated in FIG. 11.

In the bonding of the second panel PN2, the second panel PN2 may be disposed on the PSA (in which the beads have been dispersed and disposed in the non-folding area NA), as illustrated in FIG. 12.

For example, the second manufacturing method of the organic light emitting diode display 100 according to the exemplary embodiment may be different from the first manufacturing method of the organic light emitting diode display 100 according to the exemplary embodiment (e.g., in which the beads are dispersed after the first adhesive layer is stacked), in that the beads may be pre-dispersed in the first adhesive layer before the first adhesive layer is stacked, and there may be no separate curing process after bonding the second panel PN2.

As described above, the second manufacturing method of the organic light emitting diode display 100 according to the exemplary embodiment may manufacture the organic light emitting diode display 100, which is capable of uniformly maintaining hardness of the entire display, even against folding stress, even though the PSA is used as a material of the first adhesive layer.

Hereinafter, a third manufacturing method of the organic light emitting diode display 100 according to the exemplary embodiment will be described with reference to FIGS. 13 to 16.

FIGS. 13 to 16 illustrate stages in a third manufacturing method of the organic light emitting diode display according to an exemplary embodiment.

The third manufacturing method of the organic light emitting diode display 100 according to the exemplary embodiment may include, e.g., preparing the first panel PN1 having flexibility; disposing column spacers on the non-folding area NA of the first panel PN1; applying the first adhesive layer on an upper surface of the first panel PN1 (e.g., the surface of the first panel PN1 that includes the column spacers thereon); and bonding the second panel onto the first adhesive layer.

Figure 13:
FIGS. 13 to 16 illustrate stages in a third manufacturing method of the organic light emitting diode display according to an exemplary embodiment.

In the preparing of the first panel PN1, the first panel PN1 may be prepared as a base as illustrated in FIG. 13. The first panel PN1 may be a display panel in which a thin film transistor, an organic light emission layer, an electrode layer, and an encapsulation layer are sequentially stacked as described above.

Figure 14:
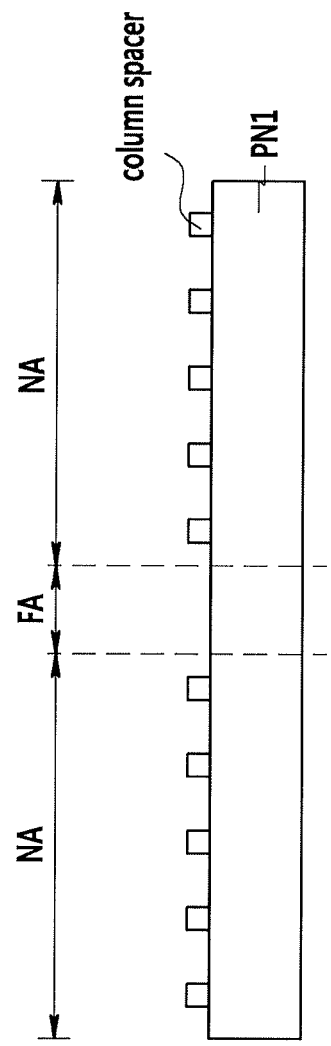

In the disposing of the column spacers, two or more column spacers may be spaced apart from each other on the non-folding area NA of the first panel PN1, as illustrated in FIG. 14.

Figure 15:
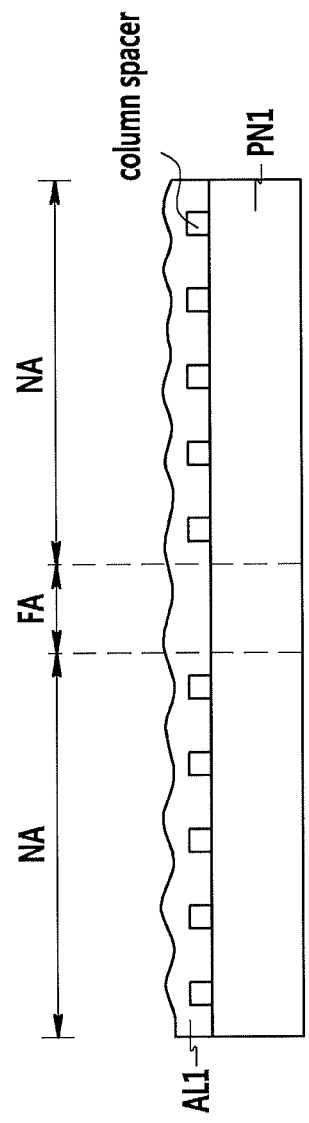

In the applying of the first adhesive layer, the liquid OCR may be applied on the upper surface of the first panel PN1 (e.g., the surface on which the column spacers have been disposed) as illustrated in FIG. 15. The OCR may be applied to be thicker than the column spacer so as to cover all of upper portions of the column spacers.

Figure 16:
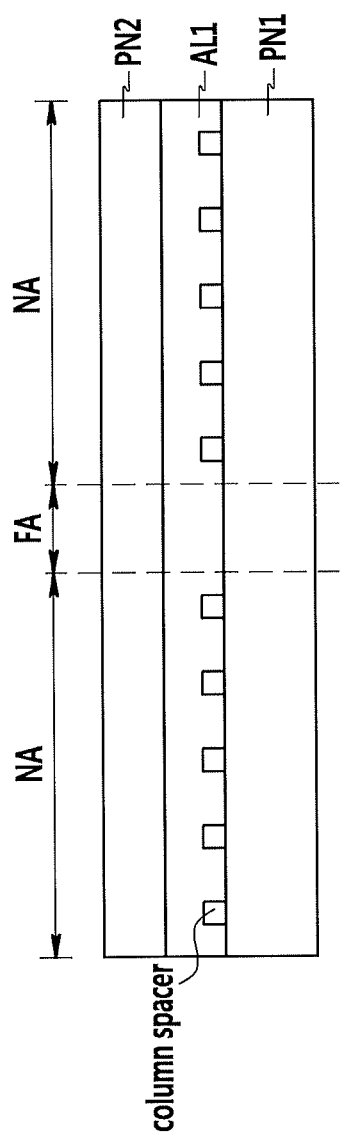

In the bonding of the second panel PN2, the second panel PN2 may be disposed on the liquid OCR (in which the column spacers have been dispersed to be spaced apart from each other in the non-folding area NA), and then the OCR may be cured as illustrated in FIG. 16.

For example, the third manufacturing method of the organic light emitting diode display 100 according to the exemplary embodiment may be different from the aforementioned first and second manufacturing methods in that the column spacers may be disposed to be spaced apart from each other in the first adhesive layer.

As described above, the third manufacturing method of the organic light emitting diode display 100 according to the exemplary embodiment may manufacture the organic light emitting diode display 100, which is capable of uniformly maintaining hardness of the entire display even against folding stress, even when the column spacers are disposed instead of the beads.

By way of summation and review, in a foldable display device, which is foldable about one axis, in order to satisfy foldable flexibility, respective layers, e.g. a window, a touch panel, and a display panel, may be maximally thinly formed. The respective layers are bonded by using a high elastic material, such as an optical clear resin (OCR) or a pressure sensitive adhesive (PSA).

In a behavior of a folded area by a folding stress during a folding operation of the foldable display device, the high elastic adhesive layer may exhibit an outstanding elastic deformation behavior compared to other layers, and folding stress may influence an adhesive layer positioned in a surrounding area.

For example, the area folded by the folding stress and the adhesive layer in the surrounding area may be elastically deformed during the folding operation, thereby causing a reduction in hardness of the entire display.

The embodiments may provide an organic light emitting diode display having improved hardness, e.g., enough to be applicable to a foldable display device, which is capable of performing a folding operation.

The embodiments may provide an organic light emitting diode display, which is capable of uniformly maintaining hardness of an entire display so as to maintain uniform hardness (even when the display device is folded about one axis as a reference axis) by improving hardness of an adhesive layer.

According to the exemplary embodiments, in the organic light emitting diode display, a deformation rate of an adhesive layer due to folding stress may be decreased (compared to the entire window substrate) by forming a base of a third panel as multiple layers including a first base film and a second base film, thereby improving hardness of the window substrate without degrading flexibility of the entire window substrate.

Further, according to the exemplary embodiments, in the organic light emitting diode display, it is possible to minimize degradation of hardness of the non-folding area due to folding stress by disposing reinforcing materials in non-folding areas of first, second, and third adhesive layers, respectively.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

| | |
|---|---|
| 100: Organic light emitting diode display | |
| AX: Folding central axis | |
| FA: Folding area | NA: Non-folding area |
| PN1: First panel | PN2: Second panel |
| PN3: Third panel | |
| BF1: First base film | BF2: Second base film |
| FN: Functional layer | |
| AL1: First adhesive layer | AL2: Second adhesive layer |
| AL3: Third adhesive layer | |
| RF1: First reinforcing material | RF2: Second reinforcing material |

What is claimed is:

1. An organic light emitting diode display, which is foldable about a folding central axis, and in which a folding area including the folding central axis and a non-folding area except for the folding area are defined, the organic light emitting diode display comprising:
    a first panel having flexibility;
    a second panel on the first panel and having flexibility;
    a third panel on the second panel and having flexibility;
    a first adhesive layer between the first panel and the second panel to bond the first panel and the second panel to each other; and
    a second adhesive layer between the second panel and the third panel to bond the second panel and the third panel to each other,
    wherein at least one of the first adhesive layer and the second adhesive layer includes a first reinforcing material.

2. The organic light emitting diode display as claimed in claim 1, wherein:

the first panel is a display panel,
the second panel is a touch panel, and
the third panel is a window substrate.

3. The organic light emitting diode display as claimed in claim 1, wherein the non-folding area of the at least one of the first adhesive layer or the second adhesive layer includes the first reinforcing material.

4. The organic light emitting diode display as claimed in claim 1, wherein the first reinforcing material includes at least one bead.

5. The organic light emitting diode display as claimed in claim 4, wherein the at least one bead includes a transparent silicon bead.

6. The organic light emitting diode display as claimed in claim 4, wherein the at least one bead has an exterior diameter that is smaller than a thickness of the first adhesive layer or the second adhesive layer that includes the at least one bead.

7. The organic light emitting diode display as claimed in claim 1, wherein the first reinforcing material includes at least one column spacer.

8. The organic light emitting diode display as claimed in claim 7, wherein the at least one column spacer includes a transparent column spacer.

9. The organic light emitting diode display as claimed in claim 7, wherein the at least one column spacer has a height that is smaller than a thickness of the first adhesive layer or the second adhesive layer that includes the at least one column spacer.

10. The organic light emitting diode display as claimed in claim 7, wherein the first reinforcing material includes two or more column spacers.

11. The organic light emitting diode display as claimed in claim 10, wherein intervals between adjacent column spacers are the same as intervals between other adjacent column spacers.

12. The organic light emitting diode display as claimed in claim 1, wherein:
the third panel includes:
a first base film bonded to the second panel by the second adhesive layer;
a second base film on the first base film; and
a functional layer bonded to the second base film, and
the first base film and the second base film are bonded to each other by a third adhesive layer.

13. The organic light emitting diode display as claimed in claim 12, wherein the non-folding area of the third adhesive layer includes a second reinforcing material.

14. The organic light emitting diode display as claimed in claim 13, wherein the second reinforcing material includes at least one bead or at least one column spacer.

15. The organic light emitting diode display as claimed in claim 14, wherein:
the second reinforcing member includes the at least one bead, and
the at least one bead has an exterior diameter that is smaller than a thickness of the third adhesive layer.

16. The organic light emitting diode display as claimed in claim 14, wherein:
the second reinforcing member includes the at least one column spacer, and
the at least one column spacer has a height that is smaller than a thickness of the third adhesive layer.

17. A method of manufacturing an organic light emitting diode display, in which a folding area including a folding central axis and a non-folding area except for the folding area are defined, and which is foldable about the folding central axis, the method comprising:
preparing a first panel having flexibility;
stacking a first adhesive layer on the first panel; and
bonding a second panel to the first adhesive layer,
wherein the first adhesive layer includes beads in the non-folding area thereof.

18. The method as claimed in claim 17, further comprising dispersing the beads after stacking the first adhesive layer on the first panel when the first adhesive layer is an optical clear resin.

19. The method as claimed in claim 17, further comprising dispersing the beads in the non-folding area of the first adhesive layer prior to stacking the first adhesive layer on the first panel when the first adhesive layer is a pressure sensitive adhesive.

20. A method of manufacturing an organic light emitting diode display, in which a folding area including a folding central axis and a non-folding area except for the folding area are defined, and which is foldable about the folding central axis, the method comprising:
preparing a first panel having flexibility;
disposing column spacers on the non-folding area of the first panel;
applying a first adhesive layer on a surface of the first panel that includes the column spacers thereon; and
bonding a second panel to the first adhesive layer.

* * * * *